United States Patent [19]

Zieve

[11] Patent Number: 5,046,345
[45] Date of Patent: Sep. 10, 1991

[54] POWER SUPPLY FOR ELECTROMAGNETIC PROOF LOAD TESTER AND DENT REMOVER

[76] Inventor: Peter B. Zieve, 5766 27th Ave. NE., Seattle, Wash. 98105

[21] Appl. No.: 451,106

[22] Filed: Dec. 15, 1989

[51] Int. Cl.⁵ ............................................. B21D 1/06
[52] U.S. Cl. ....................................... 72/56; 72/707; 361/155
[58] Field of Search ................... 72/56, 707; 361/155, 361/156

[56] References Cited

U.S. PATENT DOCUMENTS

| | | | |
|---|---|---|---|
| 3,900,770 | 8/1975 | Kaufman | 361/156 |
| 4,148,091 | 4/1979 | Hansen et al. | 72/56 |
| 4,473,862 | 9/1984 | Hill | 361/155 |
| 4,757,419 | 7/1988 | Masaki | 361/156 |

Primary Examiner—Lowell A. Larson
Attorney, Agent, or Firm—Jensen & Puntigam

[57] ABSTRACT

A power supply for use with an electromagnetic force system used for dent removal or proof load testing, wherein the power supply includes slow and fast current pulse systems. The slow current pulse system includes a capacitor bank which is charged up to 1000 volts, while the fast current pulse system includes a capacitor bank which is charged up to 10k volts. Control switches are provided for each system which result in discharge of the respective capacitor banks into a work coil adjacent the workpiece at selected times. A crowbar circuit is provided across the coil, and is triggered following discharge of the fast current pulse system. The crowbar circuit includes a series connection of several diodes to block the high negative reverse voltage and an SCR to block the low forward voltge, the SCR being triggered at the selected time to initiate conduction of the crowbar. An anti-parallel diode is connected across the SCR to prevent possible damage to the SCR caused by the rapid sequence of the reverse voltage and the rapidly rising current pulse.

21 Claims, 3 Drawing Sheets

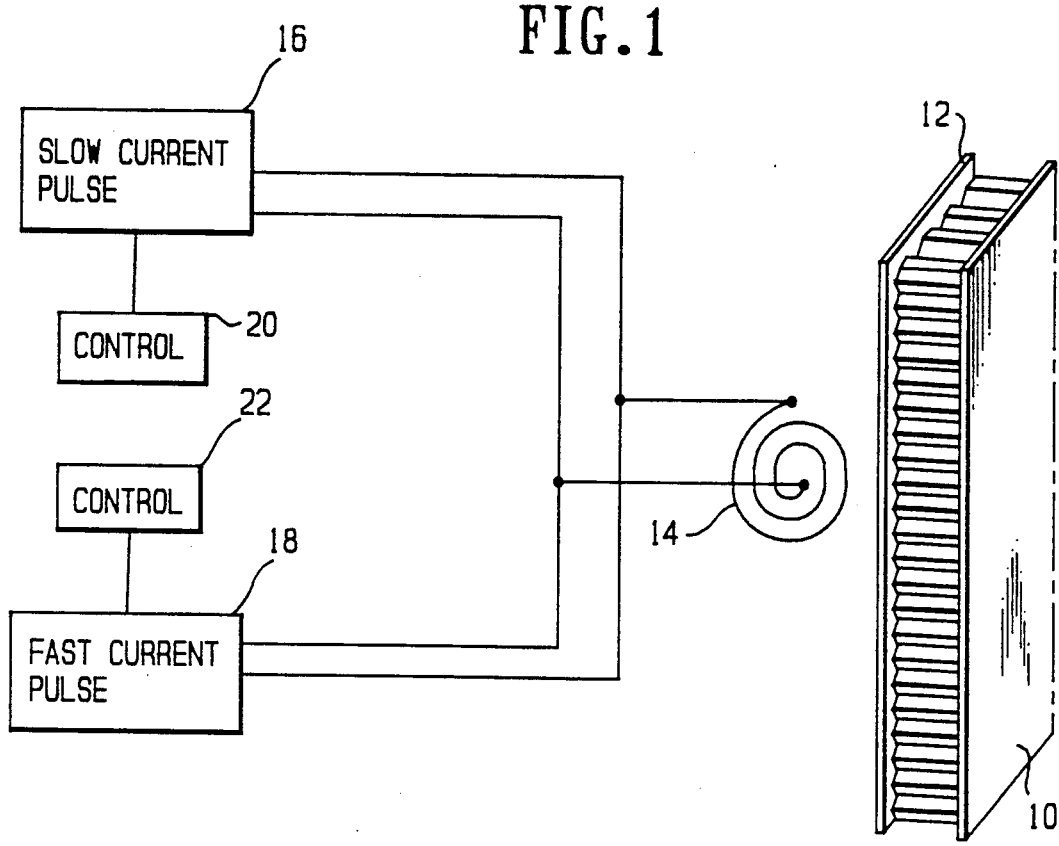
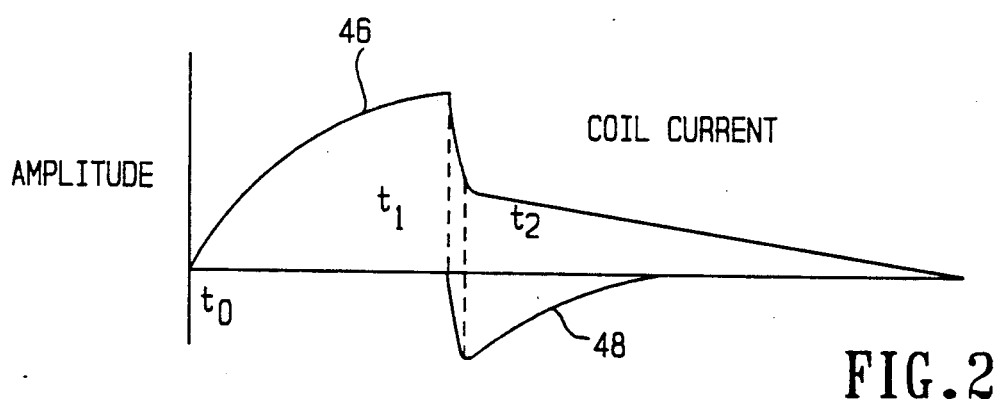
FIG.2
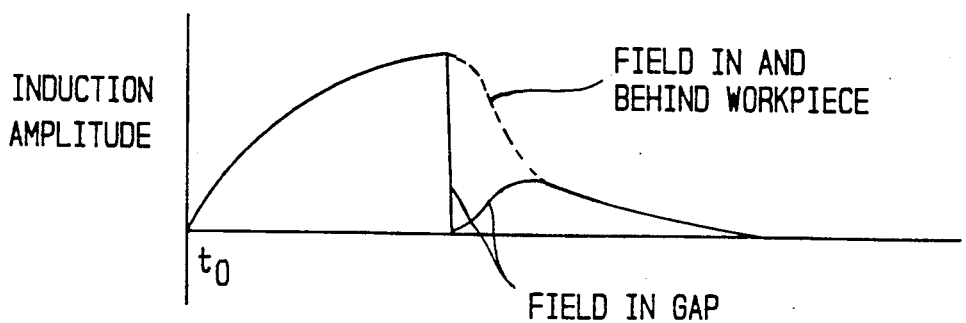

POWER SUPPLY FOR ELECTROMAGNETIC PROOF LOAD TESTER AND DENT REMOVER

DESCRIPTION

1. Technical Field

This invention generally concerns a system for producing a tension force useful for dent removal and proof load testing of the bond between electrically conducting sheet metal face members and a stiffened backing member, e.g., an aircraft panel, by electromagnetic energy, and more specifically concerns a power supply used in such systems.

2. Background Art

It is generally well known to use electromagnetic energy to produce a pulling (tension) force in electrically conducting members such as, for instance, honeycomb aircraft panels. An example of such a system directed specifically toward dent removal is U.S. Pat. No. 3,998,081 to Hansen et al. The '081 patent teaches a general system for producing tension on a sheet metal panel. A relatively low voltage (less than 1000 volts) is discharged to produce what is referred to as a slow rising current pulse which is directed through a work coil positioned adjacent the dented area of the panel. A magnetic field is established in and immediately behind the workpiece and in the gap between the coil and the workpiece. When the slow current pulse is in the vicinity of its peak amplitude at a time of approximately 1½ milliseconds from initial discharge, a high voltage (approximately 10 kv) is discharged to produce a fast rising current pulse opposite in polarity to the slow pulse. The discharge of the fast current pulse occurs, in time, in the vicinity of the occurrence of the peak of the slow current.

The total current through the coil is reduced significantly (approximately 50%) in a very short time span, which results in a cancellation of the magnetic field in the gap between the coil and the workpiece while the magnetic field in and behind the workpiece decreases with a delay due to magnetic diffusion determined by the conductivity of the material comprising the workpiece. The magnetic field in and behind the workpiece is only slightly affected during the very short time that the magnetic field in the gap is substantially cancelled. This results in a short-term sharp tension force on the workpiece, which, in effect, pulls the depressed, i.e. dented, area outwardly sufficiently to remove the dent.

U.S. Pat. No. 4,148,091 to Hansen et al also teaches the above principles with a somewhat different coil approach and sets forth in some detail the relationship between the slow and fast current pulses, the magnetic fields and the resulting tension on the workpiece.

Dent removal from aircraft parts is quite important, and extraordinary measures are often used to remove or repair such dents. This is primarily due to a rather significant increase in fuel costs caused by such dents. On a yearly basis, the effect on fuel costs can amount to thousands of dollars for each airplane.

Such electromagnetic pulsing systems are also used for nondestructive proof loading, such as described in U.S. Pat. No. 3,825,819 to Hansen et al. In proof loading, the large magnetic field gradient which is present when the magnetic field in the gap is cancelled, results in high tension forces at the bond lines in the member being tested, which will tend to force the bonded elements (i.e. the sheet metal face member and the honeycomb backing member) away from each other, if the bond is poor or has already partially failed. Any delamination or other failure of the bond can then be detected by a conventional sensing apparatus, such as a water jet ultrasound apparatus.

Although the basic principles of electromagnetic dent removers/proof loaders are thus relatively well known, a reliable, practical implementation of such a system has not yet been achieved despite numerous attempts over a long period of time. The operational reliability of existing systems has proven to be quite low, and such systems in addition are typically quite expensive. Further, the performance, i.e. the results, of existing systems has proven to be marginal.

DISCLOSURE OF THE INVENTION

Accordingly, the present invention is a power supply for an electro-magnetic force system, which includes a work coil positioned adjacent a workpiece, including a slow current pulse system, a means for discharging the slow current pulse system at a selected time, a fast current pulse system wherein the fast current pulse is of opposing polarity to the slow current pulse, a means for discharging the fast current pulse system through the coil such that the current through the coil decreases rapidly and the magnetic field in the gap decreases substantially while the magnetic field which is in and behind the workpiece decreases only slightly, resulting in a large field gradient across the thickness of the workpiece and the resulting creation of a pulse of tension force on the workpiece, and means for crowbarring the current through the coil following discharge of the fast pulse system to clamp the current through the coil at a selected level, the crowbar means including an SCR capable of withstanding, i.e. blocking, the voltage of the slow current pulse system, at least one diode in series with the SCR capable of blocking the voltage of the fast current pulse system, and means for triggering the SCR to cause the crowbar means to conduct.

BRIEF DESCRIPTION OF THE DRAWINGS

FIG. 1 is a simplified schematic representation of an electromagnetic proof dent remover/proof load tester.

FIG. 2 is a diagram showing the coil current and the magnetic field in the gap and in and behind the workpiece over time for the system of FIG. 1.

BEST MODE FOR CARRYING OUT THE INVENTION

Figure 3:
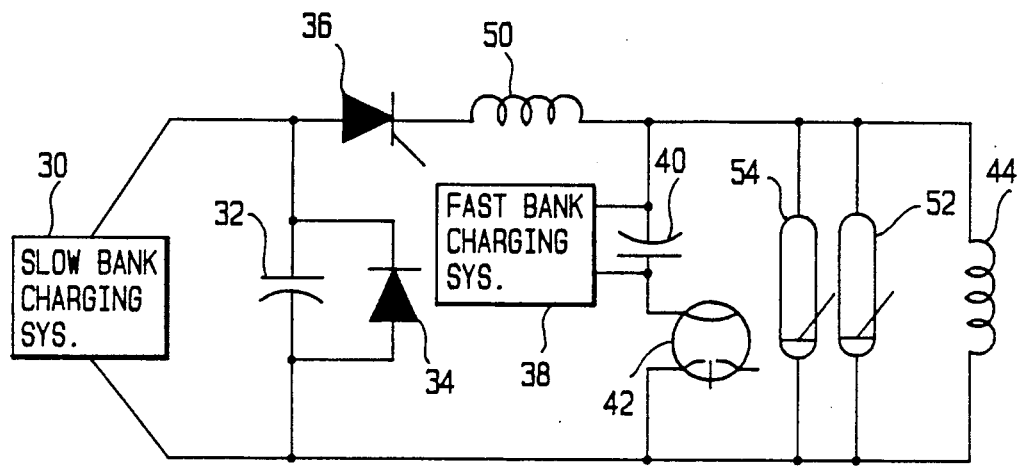
FIG. 3 is a block diagram of a power supply system known in the art for use in the system of FIG. 1.

FIG. 1 shows a simplified diagram of a dent remover/proof loader using electromagnetic energy. While the present invention is useful both for electromagnetic dent removal and proof loading, the description hereinafter will, for purposes of simplicity of explanation, focus on the dent pulling application. Also, the dent puller structure will be described in use with a honeycomb aircraft panel, again for the purpose of simplicity and clarity of explanation, although the invention can be used to remove dents, etc. from other elements.

FIG. 1 includes a honeycomb panel workpiece shown generally at 10, which includes a dented exterior sheet 12.

Adjacent the exterior sheet 12 is a work coil 14, which forms part of a hand held "head element". An example of such a head element and the relationship thereof to the remainder of the electromagnetic system is shown in U.S. Pat. No. 4,135,379 to Hansen et al. However, it should be understood that other head configurations and other coil arrangements may be used in the electromagnetic dent remover system of which the present invention is a part.

Connected in parallel with the coil 14 are a slow current pulse system 16 and a fast current pulse system 18, both of which include energy storage devices such as electrolytic capacitors and associated charging circuits. The discharge of the slow current pulse system 16 is controlled by control circuit 20, while the discharge of fast current pulse system 18 is controlled by control circuit 22. Control circuits 20 and 22, respectively, generally include switching devices and related elements. The system will also typically include a blocking inductor which in essence forces fast bank current through coil 14, as well as various protective elements to prevent damage due to the high voltages present.

A power supply known in the art for the above-identified system is shown in FIG. 3. FIG. 3 includes a slow bank charging system 30 and a slow capacitor bank (typically a plurality of electrolytic capacitors) shown at 32. The slow capacitor bank typically has a capacity of either 500 or 1000 volts. A protective diode 34 is connected in anti-parallel with capacitor bank 32 to prevent a negative voltage excursion on the capacitors, which would be quite harmful to the electrolytic capacitors. SCR 36 controls the discharge of the slow capacitor bank 32.

The fast bank charging system is shown at 38, and its associated fast capacitor bank is shown as a unit at 40. The discharge of the fast capacitor bank 40 is controlled by a high voltage ignitron or triggered spark gap switch 42. Generally a spark gap is more reliable than an ignitron. The slow capacitor bank and fast capacitor bank are electrically connected to a work coil 44 in a head element, which in operation is positioned adjacent the workpiece (not shown).

Referring now to FIGS. 2 and 3, in the operation of the power supply of FIG. 3, SCR 36 fires, and the slow capacitor bank 32 discharges. A current increases in the work coil 44 until time $t_1$. This current increase through the coil is shown as 46 in FIG. 2. In the embodiment shown, $t_1$ is approximately 1½ milliseconds from $t_0$, although this time could be varied. At time $t_1$, spark gap 42 fires, discharging capacitor bank 40, which produces a current flow through the coil 44 in the opposite direction from that produced by the slow capacitor bank. The current pulse from the fast capacitor bank is shown as 48 in FIG. 2. A blocking inductor 50 hinders the current flow from the fast capacitor bank from all passing through the slow bank and its associated diode, so that a substantial portion (30-70%) passes through the work coil 44.

Following the discharge of the fast bank system, the crowbar ignitrons 52 and 54 are fired at time $t_2$. Typically, ignitrons 52 and 54 are used as a redundant pair in order to increase system reliability. The firing of the ignitrons will, in effect, clamp the current through the coil following the fast current pulse (at time $t_2$) and will thereby prevent oscillations, i.e. ringing, between the coil and the fast and slow capacitor banks.

The proper operation of the crowbar circuit is extremely important to the overall system. In the past, the crowbar circuit has not been particularly reliable. The ignitrons become inoperative due to slight movement of the apparatus or for other several reasons. The present invention includes a crowbar circuit which is significantly more reliable.

During the time of the fast current pulse (between times $t_1$ and $t_2$, typically about 25 microseconds) there results an immediate decrease of the magnetic field in the gap between the work coil and the workpiece, as shown clearly in the gap field diagram of FIG. 2. The magnetic field in and behind the workpiece decreases only slightly, however, during a short time period (10-100 microseconds) when the gap field is cancelled, and during this time, there thus exists a significant field gradient across the workpiece and hence significant tension force on the workpiece, on the order of 1000 psi, which results in movement of the dented surface outwardly toward the coil. Careful use of the apparatus will restore the workpiece surface substantially to its original configuration, which is a highly desirable result.

Figure 4:
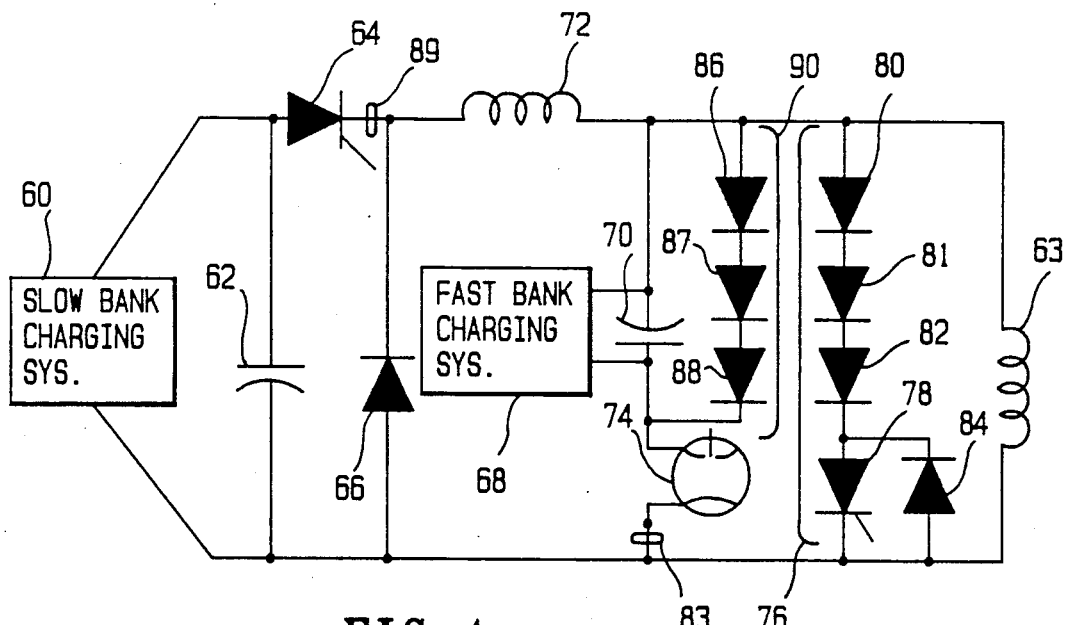
FIG. 4 is a block diagram of the power supply system of the present invention.

The power supply circuit of the present invention, which is designed to replace that shown in FIG. 3, is shown in FIG. 4. FIG. 4 includes a slow bank charging system 60 and a slow capacitor bank 62. The slow capacitor bank 62 is fired by SCR 64. Two or more SCRs, each connected in parallel with their own capacitor barks, could be used to reduce stress on the individual SCRs. Protective flyback diode 66, instead of just being connected across the slow capacitor bank 62 as taught by the prior art, is connected across both the slow capacitor bank 62 and the SCR 64. This will protect the SCR against an accidental firing of the fast capacitor bank when the SCR 64 is not in conduction. The rising current from an accidental discharge of the fast capacitor bank will be carried by the diode 66, thus preserving both the SCR 64 and the slow bank capacitors 62. The SCR is prevented from being forced into conduction by the high forward voltage, which would likely damage the SCR. and negative voltage is prevented from reaching the capacitors.

A fast bank charging circuit 68 operates with fast bank capacitor bank 70. A pickup transformer 89 monitors the current from the slow bank system. If the current is not large enough, the fast bank system is prevented from firing. A blocking inductor 72 prevents the current produced by the fast bank system from all flowing back to the slow bank 62, thus in essence "forcing" a significant amount of current to the coil 63. A spark gap switch 74 controls the discharge of fast capacitor bank 70.

The solid state crowbar circuit 76 in the embodiment shown comprises a series connection of a crowbar SCR 78 and three diodes 80, 81, 82. This series arrangement of an SCR and three diodes is important to the proper operation of the circuit. Three diodes are used in this embodiment on the basis that each diode is rated at 2600 volts and the reverse voltage will be a maximum of 7500 volts. The number of diodes used in a particular system will depend upon the maximum voltage of the fast capacitor bank and the rating of the diodes.

As stated above, the purpose of the crowbar circuit 76 is to provide at the appropriate time a short circuit across the work coil in order to clamp the current in the circuit and prevent ringing. This is essential to produce the desired tension, i.e. pulling force. In order to accomplish this, the crowbar must be able to "block", i.e. withstand, a relatively small forward voltage, i.e. 1000 volts, and a large reverse voltage (up to 10 kv), with a fast transition there between, prior to the triggering of the SCR 78 which provides the required short circuit across the coil.

While many attempts to provide such a crowbar circuit by means of solid state elements to replace the unreliable ignitrons have been attempted, no successful solid state crowbar circuit for use in a system such as described herein has been developed prior to the present invention.

In the crowbar circuit of the present invention, the SCR 78 blocks the relatively low forward voltage from the slow bank system (1000 v). However, SCR 78 alone is not capable of withstanding the high reverse voltage from the fast bank system. The fast transition between blocking the forward and reverse voltages and then conducting would likely damage the SCR.

In the circuit of FIG. 4, SCR 78 is used only to block the forward voltage (1000 v). The large reverse voltage is blocked by diodes 80-82 which are connected in series with SCR 78. The diodes 80-82 thus prevent the SCR from having to withstand the high reverse voltage prior to conduction. In addition, an anti-parallel diode 84 is positioned directly across the SCR 78. This insures that the SCR 78 will not have a large reverse bias caused by the discharge of capacitor bank 70, and thus reduces the stress on the SCR.

In operation, when the slow capacitor bank 62 discharges, SCR 78 withstands the positive voltage, and a slow bank current is established through work coil 63. When the fast capacitor bank 70 is discharged, the diodes 80-82 withstand the high reverse voltage, with opposing fast bank current being directed to the work coil 63 and through blocking inductor 72 (approximately 50%-50%), thereby pulling the coil current down to a selected level, usually approximately 50% of peak current. None of the current goes through crowbar stack 76.

The crowbar SCR 78 is provided a gate trigger signal at the time that the fast capacitor bank 70 is still discharging but before the crowbar circuit needs to carry the crowbar current. When the diodes 80-82 are initially blocking the reverse voltage, the gate on the SCR is triggered to conduct. The SCR is thus turned on a short time before conduction is actually needed. The SCR 78 can be triggered via a high frequency pickup transformer shown diagrammatically at 83 or through logic circuitry operating relative to the discharge of capacitor bank 70.

A pickup transformer 89 monitors the magnitude of the slow bank current. If the current is not large enough, the fast bank firing circuit is disabled so as to prevent firing of the fast bank when the slow bank current is small, which could push on, and thereby possibly further damage, the workpiece.

When the SCR 78 is triggered and conducts, the entire crowbar circuit is in conduction and the voltage at work coil 63 is prevented from ringing positive. If the crowbar did not operate, the current on the coil would rise right back up and there would be no resulting pulling force on the workpiece. The crowbar current is directed through the SCR 78 and diodes 80-82, providing the short circuit capability required.

FIG. 4 also shows a fast bank discharge circuit 90. Diodes 86, 87 and 88 are connected in series across the fast capacitor bank 70. The number of diodes depends upon their rating and the fast bank voltage. These diodes will channel some crowbar current through the spark gap switch 74, slowing the transition of current and lowering the rate of current rise stress on SCR 78. Typically, the crowbar circuit 76 is in conduction after the fast bank capacitors 70 are discharged, and hence, only a relatively small current will travel through this path (diodes 86-88), since the impedance of a conducting spark gap switch is still significantly greater than that of the conducting crowbar circuit. The diodes 86-88 protect the SCR 78 and prevent the pushing of a dent in the workpiece in the event SCR 78 is not triggered or fails to conduct for some other reason. In essence, diodes 86-88, along with spark gap switch 74, provide a redundant crowbar capability. It should be understood, however, that crowbar circuit 76 could be used alone as a sole crowbar circuit, i.e. diodes 86-88 could be eliminated from the power supply circuit.

The circuit 90 can, however, also function as the sole crowbar circuit in some cases. In those situations, crowbar circuit 76 can be eliminated. This possibility depends on the voltage drop and current handling capability of the switch 74. Currently available spark gap switches are typically not adequate. An ignitron could work but has severe limitations, as described above. Advances in spark gap switch technology could, however, make circuit 90 practical.

Figure 5:
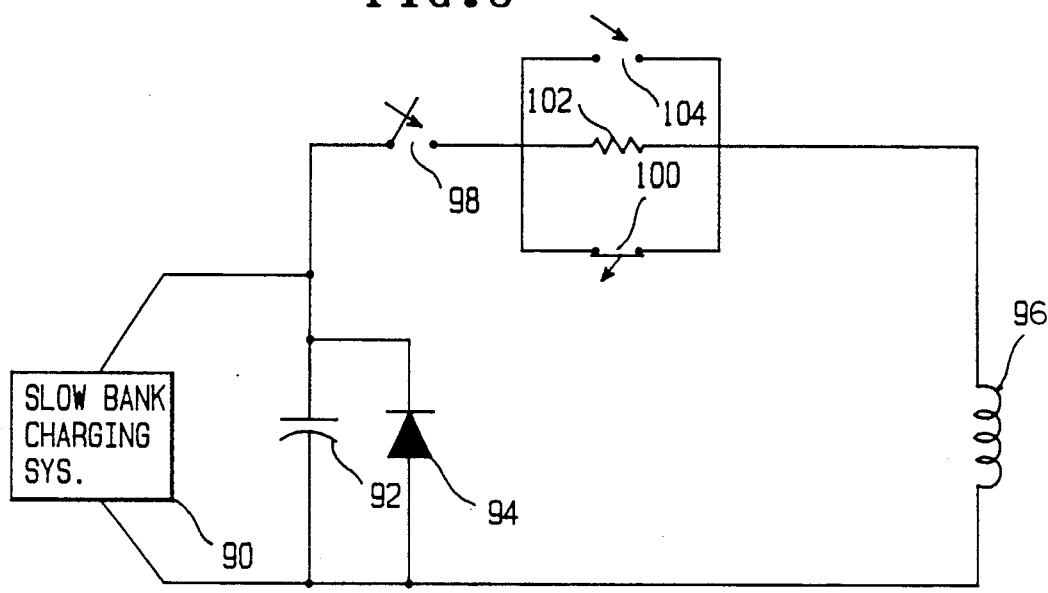
FIG. 5 is a block diagram of an alternative embodiment to the power supply of FIG. 4.

FIG. 5 shows another approach to a power supply configuration, involving an elimination of the fast bank system. The circuit of FIG. 5 includes a conventional slow bank charging system 90 and an associated capacitor bank 92, which has a flyback diode 94 connected in parallel. Capacitor bank 92 is in series with the work coil 96 which is positioned adjacent to a workpiece (not shown). When switch 98 is closed, the circuit current is directed through switch 100 to the coil 96, with the current through the coil rising (increasing) as discussed above.

When the current through the coil has risen to about its peak level, switch 100 is opened, which forces the circuit current through an energy dissipating device 102, which results in the circuit current through the coil quickly falling. When the current has fallen to a level of approximately 50%, switch 104 is closed which allows the loop current to circulate freely. The magnetic field in the gap, due to the rapidly falling current through the coil, decreases very rapidly, while the magnetic field in and behind the workpiece decreases only slightly, resulting in the same tension effect on the workpiece as for the embodiment of FIG. 4.

The elimination of the fast bank system reduces the size of the overall circuit significantly. Also, the slow bank system may itself be reduced somewhat in capacity, since there is no blocking inductor and, hence, no energy is required to establish a current through that element. The opening switch 100 in FIG. 5 may be a gate turn-off thyristor. Although such devices currently are expensive, further developments will probably significantly decrease the expense of such devices, which will then make the circuit of FIG. 5 cost effective. Also, other large current opening switches may be used, including perhaps a mechanical high speed opening switch.

While a resistor could be used as the energy dissipating device 102, a metal oxide varistor has an advantage over a resistor in that it is capable of blocking voltage below a given value. Hence, the closing switch 98 could be eliminated in particular circuit configurations where the varistor has a blocking voltage capacity at the level of the slow bank charging system.

Figure 6:
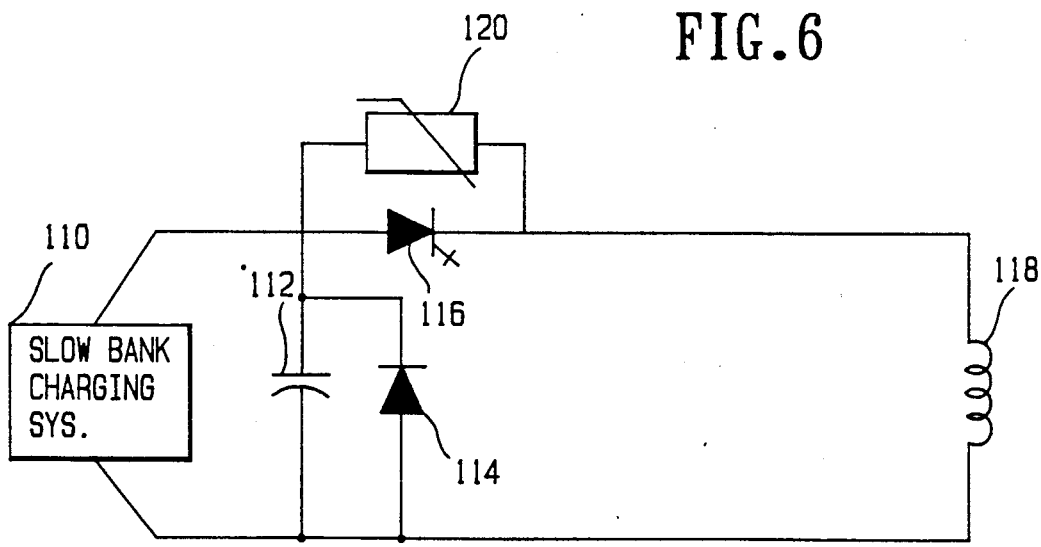
FIG. 6 is a block diagram of a variation of the power supply shown in FIG. 5.

A variation of the circuit of FIG. 5 is shown in FIG. 6. This circuit includes a slow bank charging system 110 in combination with capacitor bank 112 and a parallel flyback diode 114. With the slow capacitor bank 112 charged, a gate turn-off thyristor or similar element 116 is triggered into conduction at a selected time. This results in a rising current pulse through a work coil 118. Once the current through the coil has risen to the selected level, the thyristor 116 is triggered to its off-state, switching a metal oxide varistor 120 into the circuit so that the current through the work coil quickly falls. Once the current through the coil has fallen to the desired 50% level, thyristor 116 is triggered back on, allowing the loop current to circulate freely.

Hence, a new configuration of power supply for dent pulling and proof load testing using electromagnetic energy has been disclosed. In one embodiment a novel solid state crowbar circuit which does not include mercury ignitrons is utilized in combination with slow and fast current pulse systems to provide a reliable, efficient and relatively inexpensive system, while in other embodiments, the fast current pulse system is eliminated by use of a particular combination of solid state elements. The switching components used in the present invention are primarily solid state, and are, therefore, quite reliable in operation, as is the triggered spark gap switch.

Although a preferred embodiment of the invention has been disclosed herein for illustration, it should be understood that various changes, modifications, and substitutions may be incorporated in such embodiment without departing from the spirit of the invention which is defined by the claims which follow.

What is claimed is:

1. A power supply for an electromagnetic force system, which includes a work coil positioned adjacent a workpiece such that there is a gap therebetween, comprising:
   a slow current pulse system;
   means for discharging said slow current pulse system at a selected time;
   a fast current pulse system, wherein the fast current pulse is of opposing polarity to the slow current pulse;
   means for discharging the fast current pulse system through said coil such that the current through the coil decreases rapidly and the magnetic field in the gap decreases substantially while the magnetic field in and behind the workpiece decreases only slightly, resulting in a large field gradient across the workpiece and the creation of a pulse of tension force on the workpiece; and
   means for crowbarring the current through the coil following discharge of the fast pulse system to clamp the current through the coil at a selected level, the crowbar means including an SCR capable of withstanding the voltage of the slow current pulse system, at least one diode in series with the SCR capable of blocking the voltage of the fast current pulse system, and means for triggering the SCR to cause the crowbar means to conduct.

2. An apparatus of claim 1, wherein the slow current pulse system is approximately in the range of 500-1000 volts and the fast current pulse system is approximately in the range of 5k-10 k volts.

3. An apparatus of claim 1, including an anti-parallel diode connected across the SCR.

4. An apparatus of claim 1, wherein the slow current pulse system includes a first plurality of capacitors and a first charging circuit connected to said capacitors and wherein said slow current pulse discharging means includes a first switch connected between said capacitors and the work coil and wherein the apparatus further includes at least one diode connected across both the first switch and the first plurality of capacitors.

5. An apparatus of claim 4 wherein the first switch is an SCR.

6. An apparatus of claim 1, wherein the fast current pulse system includes a second plurality of capacitors and a second charging means connected to said capacitors.

7. An apparatus of claim 6, including at least one flyback diode connected in parallel with the second plurality of capacitors, functioning as a redundant crowbarring means.

8. An apparatus of claim 1, including means for sensing the slow current pulse and for preventing the fast current pulse system from discharging if the slow current pulse is not at a preselected level.

9. An apparatus of claim 1, including a high frequency transformer, connected to the means for discharging the fast current pulse system for triggering the crowbar SCR.

10. An apparatus of claim 1, including a logic circuit, responsive to the means for discharging the fast current pulse system, for triggering the crowbar SCR.

11. A power supply for an electromagnetic force system, which includes a work coil positioned adjacent a workpiece such that there is a gap therebetween, comprising:
    a slow current pulse system;
    means for discharging said slow current pulse system at a selected time;
    a fast current pulse system, including a fast capacitor bank, wherein the fast current pulse is of opposing polarity to the slow current pulse;
    means for discharging the fast current pulse system through said coil such that the current through the coil decreases rapidly and the magnetic field in the gap decreases substantially while the magnetic field in and behind the workpiece decreases only slightly, resulting in a large field gradient across the workpiece and the creation of a pulse of tension force on the workpiece; and
    means for crowbarring the current through the coil following discharge of the fast pulse system to clamp the current through the coil at a selected level, the crowbar means including at least one diode connected across the fast capacitor bank, wherein the diode is capable of blocking the voltage of the fast current pulse system.

12. An apparatus of claim 11, wherein the crowbarring means includes a plurality of series connected diodes connected across the fast capacitor bank.

13. An apparatus of claim 11, wherein the slow current pulse system is approximately in the range of 500-1000 volts and the fast current pulse system is approximately in the range of 5k-10k volts.

14. An apparatus of claim 11, wherein the slow current pulse system includes a first plurality of capacitors and a first charging circuit connected to said capacitors and wherein said slow current pulse discharging means includes a first switch connected between said capacitors and the work coil and wherein the apparatus further includes at least one diode connected across both the first switch and the first plurality of capacitors.

15. An apparatus of claim 14, wherein the first switch is an SCR.

16. An apparatus of claim 11, including means for sensing the slow current pulse and for preventing the fast current pulse system from discharging if the slow current pulse is not at a preselected level.

17. A power supply for an electromagnetic force system, which includes a work coil positioned adjacent a workpiece comprising:
   a slow current pulse system;
   a first switching element connected between said slow current pulse system and the work coil, said first switching element capable of being opened when current is flowing therethrough;
   means for initiating discharge of the slow current pulse system to the first switching element;
   an energy dissipating element connected in parallel with said first switching element;
   control means opening the first switching element when current through the work coil has reached approximately a peak value, thereby forcing current from the slow current pulse system through the energy dissipating element and resulting in a fast substantial decrease in current through the work coil; and
   second switching means connected in parallel with said energy dissipating means, including means for closing said second switching means when the current through the work coil has decreased substantially due to the action of the energy dissipating means.

18. An apparatus of claim 17, wherein the first switching means is a gate turn off thyristor.

19. A power supply for an electromagnetic force system, which includes a work coil positioned adjacent a workpiece, comprising:
   a slow current pulse system;
   a switching element connected between the slow current pulse system and the work coil, said switching element capable of being opened and closed;
   an energy-dissipating element capable of conducting electrical current therethrough connected in parallel with said switching means and in series with the work coil; and
   control means for (a) initially closing the switching element when the slow current pulse system is charged, such that a slow current pulse flows through the work coil, (b) opening the switching element when the slow current pulse in the work coil is approximately at its peak value, and (c) again closing the switching element when the current through the work coil has decreased to approximately 50% of the peak value, thereby clamping current through the coil at said 50% level.

20. An apparatus of claim 19, wherein the switching element is initially closed at a selected time.

21. An apparatus of claim 19 wherein the switching element is a gate turn-off thyristor.

* * * * *